United States Patent
Shen et al.

(10) Patent No.: US 6,199,188 B1
(45) Date of Patent: Mar. 6, 2001

(54) SYSTEM FOR FINDING ROOTS OF DEGREE THREE AND DEGREE FOUR ERROR LOCATOR POLYNOMIALS OVER GF(2M)

(75) Inventors: Ba-Zhong Shen, Shrewsbury; Lih-Jyh Weng, Needham, both of MA (US)

(73) Assignee: Quantum Corporation, Milpitas, CA (US)

( * ) Notice: Subject to any disclaimer, the term of this patent is extended or adjusted under 35 U.S.C. 154(b) by 0 days.

(21) Appl. No.: 09/521,518

(22) Filed: Mar. 8, 2000

Related U.S. Application Data

(63) Continuation of application No. 08/946,470, filed on Oct. 7, 1997, now abandoned.

(51) Int. Cl.[7] .................................................. H03M 13/00
(52) U.S. Cl. .......................................... 714/782; 714/784
(58) Field of Search .............................. 604/96; 708/492; 714/762, 761, 759, 782, 784

(56) References Cited

U.S. PATENT DOCUMENTS

| | | | | |
|---|---|---|---|---|
| 4,099,160 | * | 7/1978 | Flagg ................................... | 714/785 |
| 4,567,594 | * | 1/1986 | Deodhar ............................... | 714/769 |
| 4,839,896 | * | 6/1989 | Glover et al. ....................... | 714/759 |
| 4,866,716 | * | 9/1989 | Weng .................................... | 714/782 |
| 5,001,715 | * | 3/1991 | Weng .................................... | 714/782 |
| 5,710,782 | * | 1/1998 | Weng .................................... | 714/785 |
| 5,761,102 | * | 6/1998 | Weng .................................... | 708/492 |
| 5,822,336 | * | 10/1998 | Weng et al. ......................... | 714/784 |

* cited by examiner

*Primary Examiner*—Albert De Cady
*Assistant Examiner*—David Ton
(74) *Attorney, Agent, or Firm*—Cesari & McKenna

(57) ABSTRACT

A system determines the locations of four errors in a code word over $GF(2^m)$, for any m, by transforming a degree-four error locator polynomial $\sigma(x)$ ultimately into two quadratic equations, finding the solutions of these equations, and from these solutions determining the roots of the error locator polynomial. The system first manipulates the degree-four error locator polynomial into a polynomial $\theta(y)$ that has a coefficient of zero for the degree-three term. The system then factors this polynomial into two degree-two factors with four unknown variables. The system expands the factors and represents the coefficients of $\theta(y)$ as expressions that include the four unknown variables, and manipulates the expressions to produce a degree-three polynomial with only one of the unknown variables. The system next solves for that variable by finding a root of the degree-three polynomial in $GF(2^m)$ if the field is an even-bit field or in an even-bit extension of $GF(2^m)$ if the field is an odd-bit field. The system then substitutes the root into the expressions for the coefficients of $\theta(y)$ and produces a degree-two expression is with the remaining unknown variables. The system finds the roots of this expression, substitutes these values into the factors of $\theta(y)$, and sets the factors equal to zero to produce two quadratic equations. The system then solves the equations to produce the roots of $\theta(y)$, and from these solutions determines the roots of the degree-four error locator polynomial.

15 Claims, 4 Drawing Sheets

SYSTEM FOR FINDING ROOTS OF DEGREE THREE AND DEGREE FOUR ERROR LOCATOR POLYNOMIALS OVER GF(2M)

This application is a continuation of application Ser. No. 08/946,470, filed Oct. 7, 1997, now abandoned.

FIELD OF THE INVENTION

This invention relates generally to data processing systems and, more particularly, to a system for decoding and correcting errors in data using an error correction code.

BACKGROUND OF THE INVENTION

Data stored on magnetic media, such as a magnetic disks, are typically stored in encoded form, so that errors in the stored data can possibly be corrected. The errors may occur, for example, because of inter-symbol interference, a defect in the disk, or noise. As the density of the data stored on the disk increases, more errors are likely, and the system is required to correct greater members of errors. The speed with which the system corrects the errors is important to the overall speed with which the system processes the data.

Prior to recording, multiple-bit data symbols are encoded using an error correction code (ECC). When the data symbols are retrieved from the disk and demodulated, the ECC is employed to, as the name implies, correct the erroneous data.

Specifically, before a sting of k data symbols is written to a disk, it is mathematically encoded using an (n, k) ECC to form n-k ECC symbols. The ECC symbols are then appended to the data string to form an n-symbol error correction code word, which is then written to, or stored, on the disk. When the data are read from the disk, the code words containing the data symbols and ECC symbols are retrieved and mathematically decoded. During decoding, errors in the data are detected and, if possible, corrected through manipulation of the ECC symbols [for a detailed description of decoding see, Peterson and Weldon, *Error Correction Codes*, 2nd Ed. MrT Press, 1972].

To correct multiple errors in strings of data symbols, the system typically uses an ECC that efficiently and effectively utilizes the various mathematical properties of sets of symbols known as Galois fields. Galois fields are represented "GF ($P^m$)", where "P" is a prime number and "m" can be thought of as the number of digits, base "P", in each element or symbol in the field. P usually has the value 2 in digital computer and disk drive applications and, therefore, m is the number of bits in each symbol. The ECC's commonly used with the Galois Fields are Reed Solomon codes or BCH codes.

There are essentially four major steps in decoding a corrupted code word of a Reed-Solomon code or a BCH code. The system first determines error syndromes that are based on the results of a manipulation of the ECC symbols. Next, using the error syndromes, the system determines an error locator polynomial which is a polynomial that has the same degree as the number of errors. The then finds the roots of the error locator polynomial and from each root determines the location of an associated error in the code word. Finally, the system finds error values for the error locations. In binary systems, such as digital computers, there is only one possible error value for an error location, and thus, the step of determining error values is trivial.

The steps of determining the syndromes and finding the error locations are the most time consuming in the error correction process. The invention described herein reduces the time it takes the error correction system to find the locations of either three or four errors. This involves finding the roots of third and fourth degree error locator polynomials.

In prior systems, the roots of degree-four polynomials are determined by trial and error, or by matrix manipulation or look-up table. The trial and error method is performed by substituting into the polynomial every possible value, i.e., every element of the applicable $GF(2^{2m})$ that is associated with a code word location, and for each value evaluating the polynomial. If the polynomial equals zero for a given value, the value is a root. The system continues the trial and error process by substituting a next possible value into the polynomial and determining if that value is a root; and so forth, until either all possible values have been tried or all four roots are determined. This trial and error process, which in an optimized form is commonly known as a Chien Search, is time consuming. Further, the time is unpredictable, since it varies with the locations of the errors in the code words.

The matrix manipulation and look-up table methods involve transforming a general degree-four polynomial of the form:

$$\sigma_4 x^4 + \sigma_3 x^3 + \sigma_2 x^2 + \sigma_1 x + \sigma_0$$

into a polynomial of the form:

$$x^4 + x^2 + ax + b.$$

If a look-up table is used, the table contains a set of solutions for every possible set of values of a and b. For the ECCs used today, typically over $GF(2^8)$, the table has $2^{16}$ entries, each with 32 bits, i.e., four 8-bit elements. Thus, the table takes up a great deal of storage space and requires a relatively complex addressing scheme.

A system using the matrix manipulation method produces an $2^m$-by-$2^m$ matrix, by determining $f(\alpha)$, $f(\alpha^1)$, $f(\alpha^2)$ ... $fa(.\alpha^{(2^m-1)})$, where $f(x)=x^4+x^2+ax+b$. It next manipulates the matrix to determine the null space of the space spanned by the matrix. The roots of the polynomial can then be obtained from the vectors that span the null space. [For a more detailed description see, E. R Berlekamp, *Algebraic Coding Theory*, McGraw Hill Book Company, 1968]. This method requires bit-by-bit manipulation of an 2m-by-2m matrix and typically requires numerous manipulation operations to transform the matrix. Thus, it is time consuming and computation intensive.

The inventive system described herein uses the invention discussed in patent application Ser. No. 08/580,294 filed Dec. 28, 1995, now U.S. Pat. No. 5,761,102, which is assigned to a common assignee and incorporated herein by reference. The system determines the roots of the degree-four polynomial by solving two quadradic equations. The system makes use of a well known method of deter the roots of a degree-two polynomial, as descried by Berlekamp in *Algebraic Coding Theory*. Further, the system makes use of a method of determining the roots of a degree-three polynomial that is described by Van der Horst and Berger in *Complete Decoding of Triple-Error-Correcting Binary BCH Codes*, IEEE Transactions on Information Theory, Vol. IT-22, pp. 138–147, 1976. Van der Horst and Berger have established that the method works for even-bit fields $GF(2^{2m})$ for m=2 and 3. In the above-referenced application it was determined that the method works for at least even-bit fields $GF(2^{2m})$ for m=4, 5 and 6. We have determined that the method works for any $GF(2^{2m})$, as discussed below. We also provide herein a method to determine the roots of a degree-four polynomial in any odd-bit field $GF(2^{2m+1})$, as discussed in more detail below.

Finding the roots of the degree-three polynomial in accordance with the teachings of Van der Horst and Berger and in accordance with our methods discussed herein requires determining a cubic root of a Galois field element over $GF(2^{2m})$ or $GF(2^{2m+1})$. We have developed an inventive circuit for relatively quickly and easily finding the cubic roots in the even-bit field $GF(2^m)$, and in the odd-bit field $GF(2^{2m+1})$.

SUMMARY OF THE INVENTION

The invention is a system that determines the error locations of four errors in $GF(2^m)$, for any m, by transforming a degree-four error locator polynomial ultimately into two quadratic equations, finding the solutions of these equations, and from these solutions determining the roots of the error locator polynomial.

More specifically, the system first manipulates the degree-four polynomial:

$$\sigma(x) = \sigma_4 x^4 + \sigma_3 x^3 + \sigma_2 x^2 + \sigma_1 x + \sigma_0 \quad [1]$$

into the form:

$$\theta(y) = y^4 + \theta_2 y^2 + \theta_1 y + \theta_0 \quad [2]$$

where the $\theta_i$'s are combinations of the coefficients of the terms of the error locator polynomial. Note that the coefficient of the $y^3$ term is zero. The system then factors $\theta(y)$ into:

$$\theta(y) = (y^2 + t^*y + u)^*(y^2 + v^*y + w) \quad [3]$$

where "*" represents multiplication, and expands the expression to:

$$\theta(y) = y^4 + (t+v)y^3 + (t^*v + u + w)y^2 + (t^*w + v^*u)y + u^*w, \quad [4]$$

where t, u, v and w are unknown. Equating the coefficients of expressions 2 and 3, the system determines that:

$$t+v=0$$
$$t^*v + u^*w = t^2 + u^*w = \theta_2$$
$$t^*w + u^*v = t+w + t^*u = t^*(w+u) = \theta_1$$
$$u^*w = \theta_0. \quad [5]$$

The system then produces an equation with the variable t as the only unknown:

$$t^3 \theta_2 t + \theta_1 = 0 \quad [6]$$

This degree-three equation can be solved in an even-bit field $GF(2^m)$, in part, based on Cardan's Rule for real fields, which we have proven can be similarly applied to even-bit Galois Fields. Further, we use the method described by Van der Horst and Berger, all as discussed in more detail below. The degree-three equation can be solved in an odd-bit field $GF(2^{2m+1})$, using a method that utilizes an even-bit extension field $GF(2^{4m+2})$ of the odd-bit field, as discussed in more detail below.

Once a root, $t_0$, of equation 6 is determined, the root is substituted into the expression for $\theta_1$, and that expression and the expression for $\theta_0$ are used to from a quadratic equation with u and w as the roots:

$$p^2 + (\theta_2 + t_0^2)p + \theta_0 = 0 \quad [7]$$

The system then finds the roots, $p_0$ and $p_1$, of equation 7, using Berlekamp's method for solving degree-two polynomials. The roots $p_0$ and $p_1$, which are u and w, respectively, are substituted into polynomial 3 and each term is set to zero, to produce two quadratic equations:

$$y^2 + t_0^*y + p_0 = 0$$
$$y_2 + t_0^*y + p_1 = 0 \quad [8]$$

The roots of equations 8, which are determined using the Berlekamp method, are also the roots of $\theta(y)$, and they can thus be used directly to produce the roots of the error locator polynomial.

This direct solution is faster than the prior trial and error or the matrix manipulation methods of finding the four roots. Further, it does not require the storage of and entry into the large look-up table that is required in other prior known systems.

We perform a necessary step of finding cubic roots in $GF(2^{2m})$ and $GF(2^{2m+1})$ using inventive methods that require either a look-up table that is limited in size or no look-up table at all, as discussed in more detail below.

BRIEF DESCRIPTION OF THE DRAWINGS

For a fuller understanding of the nature and objects of the invention, reference should be had to the following detailed description taken in connection with the accompanying drawings, in which.

DETAILED DESCRIPTION

The mathematical operations of addition, subtraction, multiplication and division discussed herein are Galois Field operations over the applicable Galois Fields.

Figure 1:
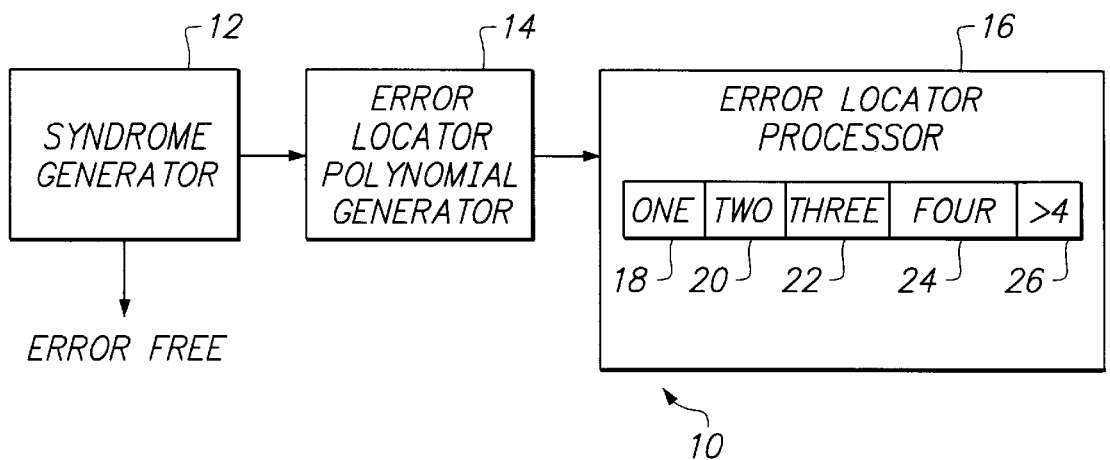
FIG. 1 is a functional block diagram of a decoder that is constructed in accordance with the invention.

Referring now to FIG. 1, a decoder 10 includes a syndrome generator 12 that operates in a conventional manner to produce an associated set of error syndromes. If the syndromes are all zero, the syndrome generator 12 determines that the code word is error-free. Otherwise, the syndrome generator sends the syndromes to an error locator polynomial generator 14, which produces in a conventional manner from the syndromes an error locator polynomial of degree "e", where e is the number of errors in the code word. The error locator polynomial generator 14 then sends the error locator polynomial to an error locator processor 16, which selects and implements an appropriate process for determining the roots of the error locator polynomial, and thus, the error locations. FIG. 1 depicts these processes as various blocks or processors, namely, a processor 18 for determining one error location, a processor 20 for determining two error locations, a processor 22 for determining three error locations, a processor 24 for determining four error locations, and a processor 26 for determining more than four error locations.

The two-, three- and four-error processors 20, 22 and 24 are interconnected. As discussed below, the error locator processor 16 reduces the time it takes to determine the locations of three and four errors by transforming the corresponding error location polynomials ultimately into associated sets of quadratic equations. To do this, the four-error processor 24 makes use of both the three-error processor 22 and the two-error processor 20. Similarly, the three-error processor 22 makes use of the two-error processor 20. While these processes are depicted as occurring in separate, dedicated processors, they may be performed in one or more multi-purpose processors.

The error locator processor 16 determines the locations of one and two errors in a conventional manner. It determines the locations of three errors over $GF(2^{2m})$ in accordance with the method described by Van der Horst and Berger, and it uses a new method, which is based in part on the method described by Van der Horst and Berger, to determine the locations of three errors over $GF(2^{2m+1})$. With either method for finding three error locations, the processor 16 uses an inventive circuit to perform a necessary step of determining the cubic root of a Galois Field element. This circuit and the method of determining the three error locations are discussed below with reference to FIGS. 5–7.

The error locator processor 16 determines the locations of four errors using a process that is described in U.S. Pat. No. 5,761,102 filed Dec. 28, 1995 entitled SYSTEM AND METHOD FOR DETERMINING THE CUBE ROOT OF AN ELEMENT OF A GALOIS FIELD $GF(2^{2m})$ which is incorporated herein by reference. We have determined that this process can be used over any Galois Field $GF(2^m)$, as discussed below. The operations of the processor in determining the four error locations is also described below with reference to FIG. 4.

A. Determining Two Error Locations

If the code word contains two errors, the error locator polynomial is of the form:

$$\sigma(x) = \sigma_2 x^2 + \sigma_1 x + \sigma_0 x. \quad [1]$$

To find the roots of the polynomial, the system sets the polynomial equal to zero:

$$\sigma(x) = \sigma_2 x^2 + \sigma_1 x + \sigma_0 x = 0 \quad [2]$$

and solves the equation for the solutions, $x_0$ and $x_1$.

To solve equation 2, the error locator processor 16 transforms the equation into the form:

$$y^2 + y + C = 0 \quad [3]$$

by changing the variable to:

$$x = \frac{\sigma_1}{\sigma_2} y \quad [4]$$

such that equation 2 becomes $$\sigma\left(\frac{\sigma_1}{\sigma_2} y\right) = \frac{\sigma_1^2}{\sigma_2} y^2 + \frac{\sigma_1^2}{\sigma_2} y + \sigma_0$$

Then, dividing by $$\frac{\sigma_2}{\sigma_1^2},$$

the system produces the equation:

$$y^2 + y + \frac{\sigma_0 \sigma_2}{\sigma_1^2} = 0 \quad [5]$$

and the C of equation 3 is thus $$\frac{\sigma_0 \sigma_2}{\sigma_1^2}.$$

For a solution of equation 5 to exist in $GF(2^m)$, the "traces" of both sides of the equation must be the same. A trace is defined as:

$$\text{Trace}(a^i) = \sum_{k=0}^{m-1} (a^i)^{2^k} \quad [6]$$

The Trace (0) equals 0, and thus, for solutions to exist within the Galois Field, $$\text{Trace } [y^2 + y + C] = 0 \quad [7]$$

The trace of a sum of terms is equal to the sum of the traces of the individual terms. In $GF(2^m)$, Trace $(y^2)$=Trace $(y)$ and their sum, using Galois Field addition, is zero. Accordingly, equation 5 has a solution in $GF(2^m)$ if Trace $(C)$=0.

The general solution to equation 5 is a linear combination of m-1 "base solutions." A base solution is a solution to equation 3 with C as one of the "base elements" $C_1, C_2 \ldots C_{2m-1}$ of the Galois Field. The base elements are those elements of the field that can be linearly combined to produce all of the other elements of the field. These elements may, for example, be the set of 1m-1 elements that each include 1m-1 zeros and a single 1, i.e., $\alpha^i$=000 . . . 1 to $\alpha^i$=100 . . . 00. In such a field, C=00110 . . . 0 is a linear combination of base elements 00100 . . . 0 and 00010 . . . 0. The general solution to equation 5 is the linear combination of the base solutions that correspond to the base elements which are summed to produce $$\frac{\sigma_0 \sigma_2}{\sigma_1^2}.$$

In $GF(2^4)$ which is defined by the generator polynomial $x^4 + x + 1$, each element, $\alpha^i$, that has a trace of zero also has a zero as its most significant bit. Accordingly; the C's of interest in this field are combinations of the base elements $\alpha^0$=0001, $\alpha^1$=0010 and $\alpha^2$=0100. The corresponding base solutions are:

$$(\alpha^5)^2 + \alpha^5 = \alpha^0 \quad \text{with } y_0 = \alpha^5$$

$$(\alpha^9)^2 + \alpha^9 = \alpha^1 \quad \text{with } y_0 = \alpha^9$$

$$(\alpha^3)^2 + \alpha^3 = \alpha^2 \quad \text{with } y_0 = \alpha^3$$

Another set of base solutions are:

$$(\alpha^{10})^2 + \alpha^{10} = \alpha^0 \quad \text{with } y_1 = \alpha^{10}$$

$$(\alpha^7)^2 + \alpha^7 = \alpha^1 \quad \text{with } y_1 = \alpha^7$$

$$(\alpha^{14})^2 + \alpha^{14} = \alpha^2 \quad \text{with } y_1 = \alpha^{14}$$

In this Galois Field, the solutions for equation 3 with C equal to $\alpha^8$=0101, for example, are determined by decomposing C into:

$$C = \alpha^0 + \alpha^2 = 0001 + 0100$$

and summing a corresponding wet of base solutions, for example:

$$y_0 = \alpha^5 + \alpha^3 = \alpha^{11}$$

to produce a first root and determining a second root as:

$$y_1 = y_0 + \alpha^0$$

Next the system determines the roots of the degree-two error locator polynomial as:

$$x_0 = y_0\left(\frac{\sigma_1}{\sigma_2}\right)$$

$$x_1 = y_1\left(\frac{\sigma_1}{\sigma_2}\right).$$

B. Determining Three Error Locations

In general, for any degree-three error locator polynomial, $\sigma(x)$, the system determines error locations by solving:

$$\sigma(x)=\sigma_3 x^3+\sigma_2 x^2+\sigma_1 x+\sigma_0=0. \quad [8]$$

Accordingly, the system changes variable to $$x = y + \frac{\sigma_2}{\sigma_3}$$

and equation 1 becomes $$\sigma\left(y+\frac{\sigma_2}{\sigma_3}\right) = \sigma_3\left(y+\frac{\sigma_2}{\sigma_3}\right)^3 + \sigma_2\left(y+\frac{\sigma_2}{\sigma_3}\right)^2 + \sigma_1\left(y+\frac{\sigma_2}{\sigma_3}\right) + \sigma_0 = 0. \quad [9]$$

which expands to:

$$\sigma_3\left(y^3 + y^2\frac{\sigma_2}{\sigma_3} + y\left(\frac{\sigma_2}{\sigma_3}\right)^2 + \left(\frac{\sigma_2}{\sigma_3}\right)^3\right) + \sigma_2\left(y^2 + \left(\frac{\sigma_2}{\sigma_3}\right)^2\right) + \sigma_1\left(y+\frac{\sigma_2}{\sigma_3}\right) + \sigma_0 = 0$$

and after collecting like terms and summing identical terms to zero the equation becomes:

$$\sigma_3 y^3 + 0y^2 + \left(\frac{\sigma_2^2}{\sigma_3} + \sigma_1\right)y + 0 + \frac{\sigma_1\sigma_2}{\sigma_3} + \sigma_0 = 0 \quad [10]$$

The system then divides equation 10 by $\sigma_3$, and the equation becomes:

$$y^3 + ay + b = 0 \quad [11]$$

with $$a = \frac{\sigma_2^2}{\sigma_3^2} + \frac{\sigma_1}{\sigma_3} \text{ and } b = \frac{\sigma_0}{\sigma_3} + \frac{\sigma_1\sigma_2}{\sigma_3^2},$$

and $y_0$ is a solution of equation 11 if and only if $$y_0 + \frac{\sigma_2}{\sigma_3}$$

is a solution of equation 8. Accordingly, we can determine the solutions of equation 8 by determining the solutions of equation 11.

To determine if all of the roots of equation 4 are in $GF(2^{2m})$ i.e., an even-bit field, we use Cardan's Rule as applied to even-bit Galois Fields. To determine if all of the roots of equation 4 are in $GF(2^{2m+1})$, which is an odd-bit field, we use the properties of an even-bit extension field $GF(2^{4m+2})$, as discussed below. If all the roots are in the appropriate Galois Field, the system then finds the solutions of equation 11 using for an even-bit field the methods discussed the co-pending patent application, or if the system is operating over an odd-bit field, using a modification of that method, as discussed in more detail in section B2 below.

One of the necessary steps in determining the roots of equation 11 is finding cube roots. To do this, the error locator processor 16 preferably uses the subsystem of FIGS. 5–7, as discussed below. The error locator processor 16 may instead determine the cube roots of an element of $GF(2^{2m})$ using the operations described in the co-pending patent application.

B1. Solutions Over An Even-Bit Field $GF(2^{2m})$

According to Cardan's Rule as applied to even-bit Galois Fields, equation 11 has all three solutions $y_1$, $y_2$ and $y_3$ in $GF(2^{2m})$ if and only if each root $y_i$ is of the form $$y_i = x_i + \frac{a}{x_i}$$

where $x_i \in GF(2^{2m})$. This means that $y_i$ is a root of equation 11 if and only if $$x_i^2 + y_i x_i + a = 0 \quad [12]$$

has all solutions in $GF(2^{2m})$. As discussed in the co-pending patent application, an equation of the form of equation 12 has solutions in $GF(2^{2m})$ if the "traces" of both sides of the equation are the same, where a trace is defined as $Tr(\alpha) = \alpha + \alpha_2 + \ldots + \alpha^{2^{2m-1}}$.

To determine the trace of the left-hand side of the equation 12, we first define in Step 202 for a polynomial $Q(x)=(x-\alpha_1)(x-\alpha_2)(x-\alpha_3)\ldots(x-\alpha_n)$, a function $p(Q(x))$:

$$p(Q(x)) = \sum_{1 \leq i \leq j \leq n} \frac{\alpha_i \alpha_j}{(\alpha_i + \alpha_j)^2}.$$

We then determine if the trace of the functions, i.e., $Tr(p)$, for the left-hand side of equation 12 is the same as the trace of the right-hand side of the equation, i.e., $Tr(0)$, which is equal to zero.

The polynomial of interest, $x_i^2 + y_i x_i + a = (x-\alpha_1)(x-\alpha_2)$, with $\alpha_1 + \alpha_2 = y_i$ and $\alpha_1 \alpha_2 = a$, and $$p(x_i^2 + y_i x_i + a) = \frac{\alpha_1 \alpha_2}{(\alpha_1 + \alpha_2)^2} = \frac{a}{y_i^2}.$$

Accordingly, equation 12 has solutions in $GF(2^{2m})$ if and only if $$Tr\left(\frac{a}{y_i^2}\right) = 0. \quad [13]$$

Further, we determine at equation 11 has all solutions in $GF(2^{2m})$ by determining if $Tr(p(y^3+ay+b))=0$, which means that $$Tr\left(\frac{a^3}{b^2} + 1\right) = 0.$$

Over $GF(2^{2m})$, in which $Tr(1)=0$, $$Tr\left(\frac{a^3}{b^2}\right) + Tr(1) = Tr\left(\frac{a^3}{b^2}\right) + 0,$$

and thus if all solutions are $GF(2^{2m})$, $$Tr\left(\frac{a^3}{b^2}\right) = 0. \quad [14]$$

Since all solutions are in $GF(2^{2m})$, the system determines the roots of equation 11 and then the roots of equation 8. The system may use the method of determining the roots of degree-three polynomials described in the co-pending application. Specifically, using equation 11

$$y^3 + ay + b = 0 \quad [11]$$

and if $a \neq 0$, the processor 16 changes variable to:

$$y = z + \frac{a}{z} \quad [15]$$

and equation 4 becomes $$\left(z + \frac{a}{z}\right)^3 + a\left(z + \frac{a}{z}\right) + b = 0. \quad [16]$$

It next expands equation 16 and collects like terms to produce:

$$z^3 + \frac{a}{z}z^2 + \left(\frac{a}{z}\right)^2 z + \left(\frac{a}{z}\right)^3 + az + \frac{a^2}{z} + b =$$
$$z^3 + az + \frac{a^2}{z} + \frac{a^3}{z^3} + az + \frac{a^2}{z} + b = z^3 + \frac{a^3}{z^3} + b = 0. \quad [17]$$

The system next multiplies equation 17 by $z^3$ to produce $$(z^3)^2 + bz^3 + a^3 = 0, \quad [18]$$

which is a quadratic equation with $z^3$ as the variable. Equation 18 can then be solved using the two-error method discussed in Section A.

Once one solution, $z_{03}$, is determined, the system finds the cubic root, $z_0$, which is a solution to equation 11. The operations of the system to determine the cubic root are described below with reference to FIGS. 5 and 6. The system determines a second solution, $z_i$:

$$z_1 = z_0 * \alpha^{\frac{2^{2m-1}}{3}}$$

where the exponent $$\frac{2^{2m} - 1}{3}$$

is always an integer, since $2^{2m} - 1$ is divisible by 3, and a third solution:

$$z_2 = z_1 + z_0$$

The system then uses these solutions to determine the roots $x_0$, $x_1$, and $x_2$ of the degree-three error locator polynomial of equation 8. The system thus substitutes the solutions $z_i$ into the expression for y, and individually adds the results of the substitution to $$\frac{\sigma_2}{\sigma_3}$$

to produce the roots $x_0$, $x_1$ and $x_2$.

If $a=0$, the solution to equation 18 is $y=b^{1/3}$. To find the cubic root of b the system again uses the circuit depicted in FIG. 5 or 6. Once the cubic root is known, the system determines $y_1$ and $y_2$ as:

$$y_1 = y_0 * \alpha^{\frac{2^{2m-1}}{3}} \text{ and } y_2 = y_0 + y_1,$$

and from these values determines the roots $x_0$, $x_1$ and $x_2$.

B2. Solutions Over An Odd-Bit Field $GF(2^{2m+1})$

When the system is operating over $GF(2^{2m+1})$, and equation 11

$$y^3 + ay + b = 0 \quad [11]$$

has all solutions in $GF(2^{2m+1})$, we know that $$Tr\left(\frac{a^3}{b^2} + 1\right) = 0$$

and thus $$Tr\left(\frac{a^3}{b^2}\right) = 1$$

since $Tr(1)=1$ in the odd-bit field. This means that the equation 18

$$(z^3)^2 + bz^3 + a^3 = 0 \quad [18]$$

has no roots in $GF(2^{2m+1})$. Thus, the error locator processor 16 cannot use the method described above to determine the solutions of equation 11 in the odd-bit field.

The error locator processor 16 instead determines the roots in an even-bit extension field of the odd-bit field, namely, $GF(2^{4m+2})$, which is defined as $GF(2^{4m+2}) = GF(2^{2m+1})[x]/(x^2+x+1) = \{\alpha x + \beta | \alpha, \beta \in GF(2^{2m+1})\}$ with multiplication defined by:

$$(\alpha_1 x + \beta_1)(\alpha_2 x + \beta_2) \text{ modulo } x^2 + x + 1$$

such that $$(\alpha_1 x + \beta_1)(\alpha_2 x + \beta_2) = (\alpha_1\alpha_2 + \alpha_1\beta_2 + \alpha_2\beta_1, \alpha_1\alpha_2 + \beta_1\beta_2).$$

A simplified way to express $GF(2^{4m+1})$ is $$GF(2^{4m+2}) = \{(\alpha, \uparrow) | \alpha, \beta \in GF(2^{2m+1})\}.$$

Further, the odd-bit field $GF(2^{2m+1}) = \{0 + \beta | (0, \beta) \in GF(2^{4m+2})\}$. This means that we can perform multiplication operations over the extension field by manipulating the $2^{2m+1}$ bit elements of $GF(2^{2m+1})$ in the pairs that represent elements of $GF(2^{4m+2})$.

Using the extension field, we can show that since the equation:

$$y^3 + ay + b = 0 \quad [11']$$

has solutions in $GF(2^{2m+1})$, the equation $$(z^3)^2 + bz^3 + (a^3 + b^2) = 0 \quad [18']$$

also has all solutions in $GF(2^{2m+1})$. Using Cardan's Rule as applied to even-bit Galois Fields, we can show that every solution $(b, z_i)$ is a cube of $(s,t) \in GF(2^{4m+2})$, and that $$(b, z_i) = (s, t)^3$$

such that s, t and s+t are all solutions of equation 11'. The value of $z_i$ is determined using the two-error method discussed in Section A over $GF(2^{4m+1})$. The cubic root of $z_i$ is determined using one of the subsystems described below with reference to FIGS. 4–6.

Figure 2:
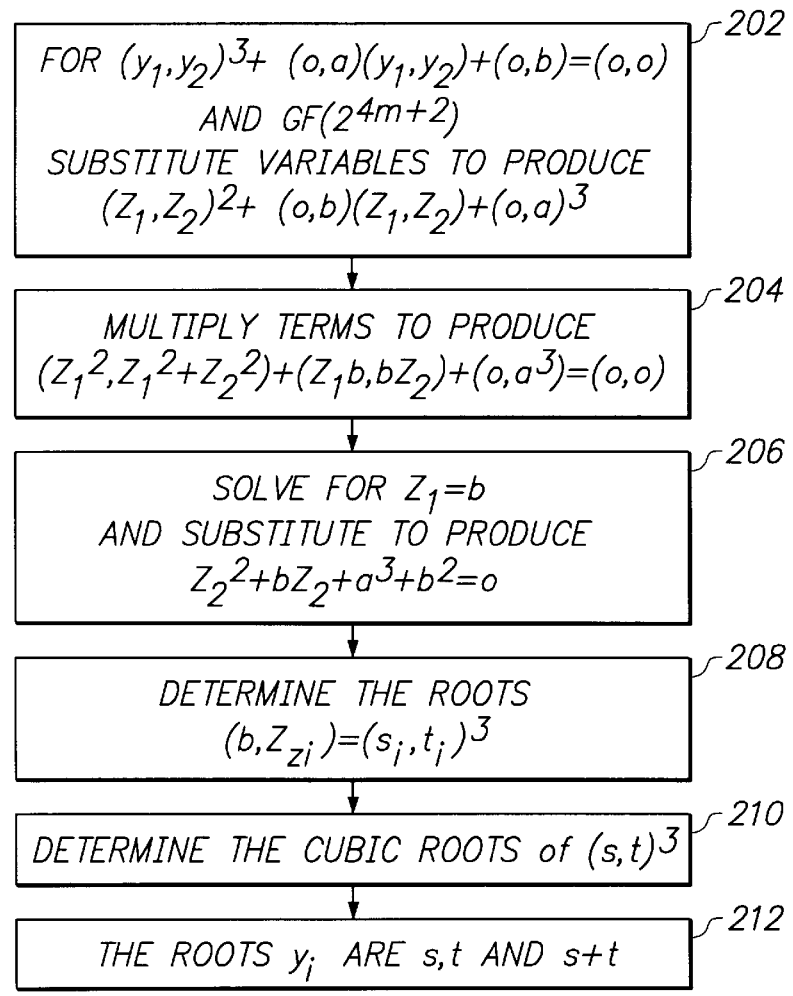
FIG. 2 is a flow chart of the operations of the decoder of FIG. 1 in determining if roots of an equation are in $GF(2^{2m+1})$.

Referring now to FIG. 2, as an example, we determine the roots of $$(y_1, y_2)^3+(0, a)(y_1, y_2)+(0,b)=0 \quad [11^*]$$

over $GF(2^{18})$, which is an extension field of $GF(2^9)$, with $a=\alpha^{41}$ and $b=\alpha^{13}$. First, we substitute variables and produce in $GF(2^{18})$ the polynomial $$(z_1, z_2)^2+(0, \alpha^{13})(z_1, z_2)+(0, \alpha^{41})^3=(0,0) \quad [18^*]$$

which is equation 18' over $GF(2^{18})$. Next, in step 204 we multiply the terms out to produce $$(z_1^2, z_1^2+z_2^2)+(z_1\alpha^{13}, \alpha^{13}z^2)+(0,(\alpha^{41})^3)=(0,0)$$

and equate the terms of the various pairs:

$$z_1^2+z_1\alpha^{13}=0$$

$$z_1^2+z_2^2+z_2\alpha^{13}+\alpha^{13}+(\alpha^{41})^3=0$$

and in step 206 solve for $z_1$:

$$z_1=\alpha^{13}$$

We then substitute $z_1=\alpha^{13}$ to produce:

$$z^2_2+(\alpha^{13})^2+z_2\alpha^{13}+(\alpha^{41})^3 = z_2^2+\alpha^{13}z_2+(\alpha^{41})^3+(\alpha^{13})^2=0 \quad [18']$$

which is equation 18' with $Z_2=Z^3$, and solve for the roots of this equation using the method of section A (step 208). The multiplication operations used to determine the roots involve the $2^9$-bit elements of equation 18'. The roots of equation 18' are $Z_{20}=\alpha^{95}$ and $Z_{21}=\alpha^{117}$, and thus, the roots of equation 18* are $z_{01}=(\alpha^{13}, \alpha^{95})$ and $z^{02}=(\alpha^{13}, \alpha^{117})$. In step 210, the system determines the cubic roots of $z_{01}$ and $z_{02}$, which are equal, and are $(\alpha^{132}, \alpha^{131})=(s,t)$. The roots of equation 11* are of the form $$(y_1, y_2) = (x_1 x_2) + \frac{(0, a)}{(x_1 x_2)}$$

and we determine in step 212 that the roots of equation 11' are s, t and s+t or $\alpha^{132}$; $\alpha^{131}$; $\alpha^{132}+\alpha^{131}=\alpha^{261}$. The system thus finds roots over the extension field $GF(2^9)$, while making its computations over $GF(2)$.

C. Finding the Roots Of Degree-Four Error Locator Polynomials

Figure 3A:
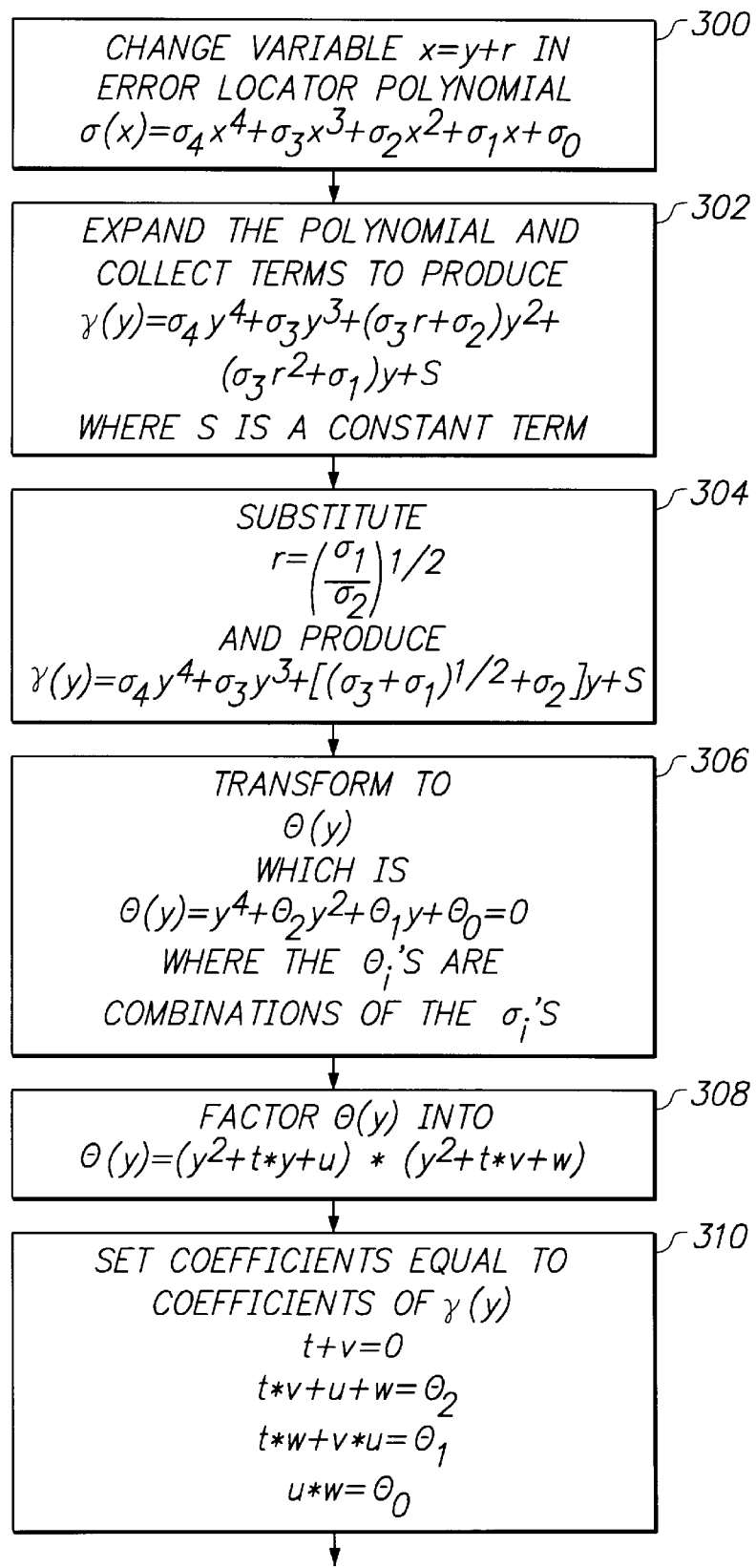
FIGS. 3A and 3B are a flow chart of the operations that the decoder of FIG. 1 performs in determining the locations of four errors.
Figure 3B:
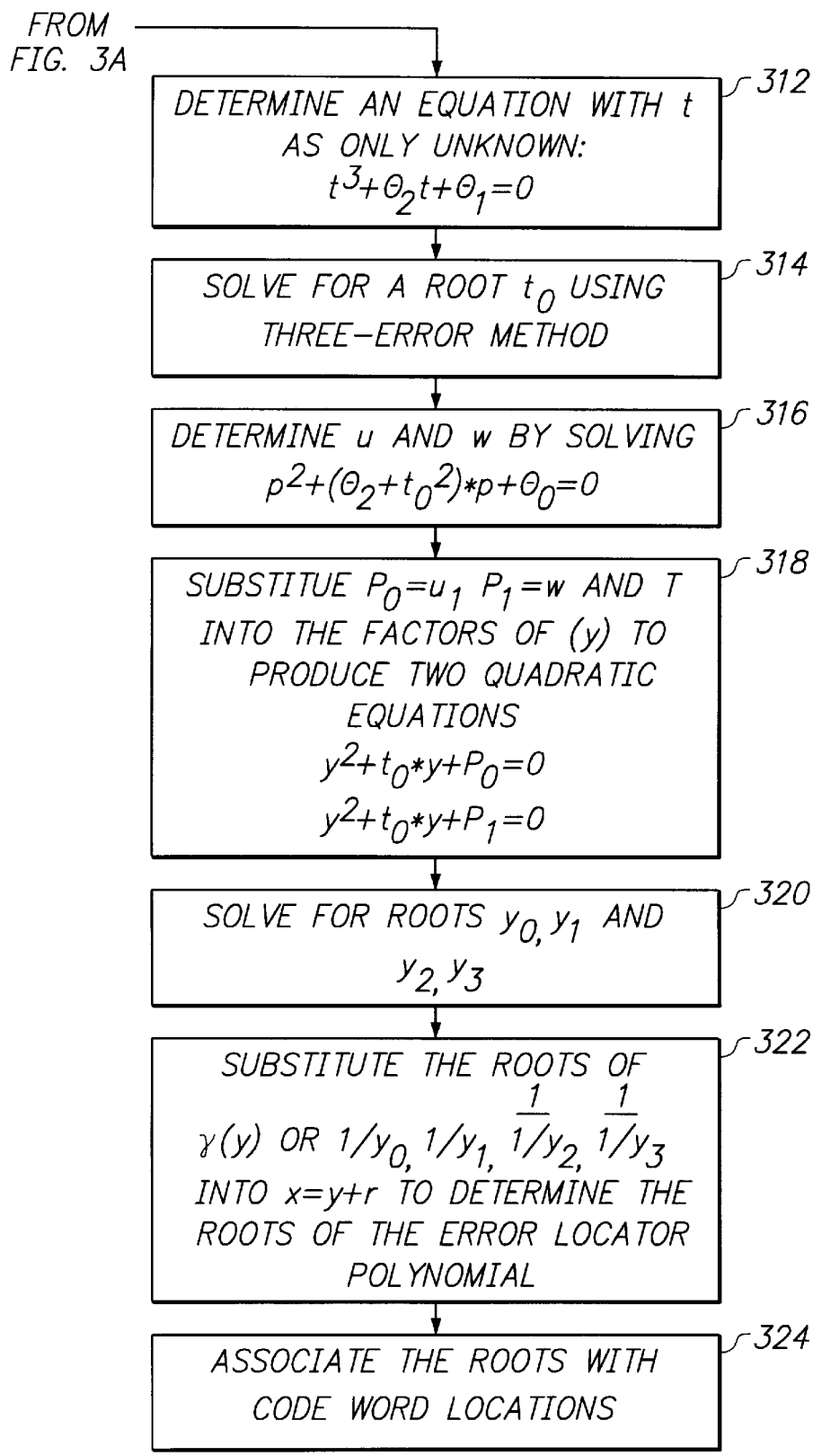

Referring to FIG. 3, and as discussed in the co-pending pent application, the error locator processor 16 can determine the roots of a degree-four polynomial, $$h(x)=\sigma_4 x^4+\sigma_3 x+\sigma_2 x^2+\sigma_1 x+\sigma_0$$

in steps 300–306 by transforming the polynomial into $$j(x)=y^4+a_2 y^2+a_1 y+a_0$$

and then in step 308 transforming the polynomial into two quadratic expressions, namely, $$j(x)=y^2+ty+u)(y^2+uv+w)$$

The system in step 310 solves for the values of t, u, v and w, and determines that the roots of $j(x)$ are $$t=v, \ tv+u+w=a_2, \ tw+uv=a_1 \text{ and } uw=a_0.$$

The system in step 312 next determines an expression in which t is the only unknown, namely, $$t^3+a_2 t=a_1=0$$

and in steps 314–316 solves for t using the methods discussed above over the appropriate odd- or even-bit field. The system then in step 318–320 determines the roots of $h(x)$ based on the substitution of variables between $h(x)$ and $j(x)$.

We now discuss how the system determines cubic roots in even- and odd-bit fields.

D. Cubic Roots In An Odd-Bit Field

In $GF(2^{2m+1})$, every element has one and only one cubic root in the field. For each element $\beta$ of $GF(2^{2m+1})$ there is an element $\beta^u$ $$u = \frac{2^{2m+2} - 1}{3}$$

in $GF(2^{2m+1})$. Further, there is also an element $$(\beta^u)^3 = \beta^{2^{2m+2}-1} \quad [20]$$

But $2^{2m+2}=2^{2m+1}+2^{2m+1}$ and equation 20 can be rewritten $$(\beta^u)^3 = \beta^{2^{2m+1}} * \beta^{2^{2m+1}-1} \quad [21]$$

In $GF(2^{2m+1})$, any element, $\alpha$, raised to the $2^{2m}$ power, i.e., $\alpha^{2^{2m}}$, equals $\alpha^0=1$ and any element raised to the $2^{2m+1}$ power is equal to the element, since $\alpha^{2^{2m+1}}=\alpha^{2^{2m}}*\alpha^1=\alpha$.

Accordingly, $\beta^{2^{2m+1}}=\beta$ in expression 21 and $$\beta^{2^{2m+1}} * \beta^{2^{2m+1}-1} = \beta^1 * (\beta^1 * \beta^{-1}) = \beta(\beta^0) = \beta,$$

which means that $\beta^u$ is the cube root of $\beta$.

Figure 4:
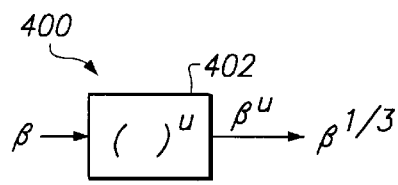
FIG. 4 is a functional block diagram of a subsystem for determining the cubic roots of elements of $GF(2^{m+1})$.

Referring now to FIG. 4, a subsystem 400 determines the cubic root of an element $\beta$ in $GF(2^{2m+1})$ by raising that element to the power u in multipliers 402, which include of one or more conventional Galois Field multipliers. In, for example, $GF(2^3)$, the multipliers 402 raise the element $\beta$ to the power:

$$\frac{2^{2(1)+2} - 1}{3} = \frac{2^4 - 1}{3} = 5$$

The multipliers 402 thus produce $$\beta^5 = (\alpha^i)^5 = \alpha^{5i}$$

by, for example, raising B to $B^{2^2}$ and multiplying the result by B. If $i=2$, $\beta=\alpha^2$, and the cube root is $\alpha^{10}$, which in $GF(2^3)$ is $\alpha^3$. To test if $\alpha^3$ is the cube root of $\alpha^2$, we multiply $\alpha^3 * \alpha^3 * \alpha^3 = \alpha^9$ and $\alpha^9 = \alpha^2 * \alpha^7$, where $\alpha^7 = \alpha^0 = 1$ in $GF(2^3)$. Accordingly, the product $(\alpha^3)^3 = \alpha^2$, and $\alpha^3$ is thus the cubic root of $\alpha^2$.

E. Cubic Roots In An Even-Bit Field

Some elements of $GF(2^{2m})$ do not have cubic roots in the field. Further, determining cubic roots in $GF(2^{2m})$ for those elements that do have roots is more complicated than determining the cubic roots of elements of an odd-bit field.

The system may use the method described in the co-pending application to determine the cubic roots of an element of $GF(2^m)$. Using this method, the system raises an element $\beta$ of $GF(2^{2m})$ to powers that correspond to factors of the identity $2^{2m}-1=(2^m-1)*(2^m+1)$, which for any value of m has one factor that is divisible by three and one factor that is not. The system then produces the values:

$$\gamma_1 = \beta^{2^m+\epsilon} \text{ and} \ldots \gamma_2 = \beta^{\frac{2^m-s}{3}}$$

where $\epsilon=1$ if m is even and $\epsilon=-1$ if m is odd.

The system next enters a look-up table to determine the cubic root of $\gamma_1$, which has the exponent that is not divisible by three. The system then produces the product:

$$\gamma_1^{1/3}\gamma_2 = (\beta^{2^m+\varepsilon})^{1/3} * \beta^{\frac{2^m-\varepsilon}{3}} = (\beta^{1/3})^{2^{m+1}} \qquad [22]$$

Finally, the system raises this product to the $2^{m-1}$ power, to produce $(\beta^{1/3})^{2^{2m}}$ which in $GF(2^{2m})$ is $(\beta^{1/3})^1$ or the cube root $\beta^{1/3}$.

This method uses a look-up table of a particular size for a given value of m. In a system with limited storage space that requires a smaller table or in which no table can be used, the system may instead incorporate, respectively, the subsystem 500 or subsystem 600 discussed below with reference to FIGS. 5 and 6.

1. A Limited Look-Up Table Method

We define a variable "N" as $$N = 2^{2m}-1 = (2^2-1)((2^2)^{m-1}+(2^2)^{m-2}+\ldots+1),$$

which is divisible by 3. There are integer values "e" and "$N_0$" such that $N=3^e N_0$ and the greatest common divisor of 3 and $N_0$ is 1. If L is a factor of $N_0$, L is also a factor of $2^{2m}-1$ and the greatest common divisor of L and 3 is 1. If we define a variable "q" as an integer where $$2^{q-1} < L < 2^q + 1$$

there is then an integer "K" such that $$2^q = 3K+1 \text{ or } 3K=2$$

and we can define an integer pair $$(Q, V) \equiv \begin{cases} (q, 0) \ldots \text{if } .L = 2^q \\ (q, K-l) \ldots \text{if } .L = 3b+1 \ldots \text{and} \ldots 2^q = 3K+1 \\ (q+1, 2K-l) \ldots \text{if } .L = 3b+2 \ldots \text{and} \ldots 2^q = 3K+1 \\ (q+1, 2K-l+1) \ldots \text{if } .L = 3b+1 \ldots \text{and} \ldots 2^q = 3K = 2 \\ (q, K-l+1) \ldots \text{if } .L = 3b+2 \ldots \text{and} \ldots 2^q = 3K = 2 \end{cases}$$

where "b" is any integer. We then can say $L+_3V=2^Q$.

If $\alpha$ is the primitive element of $GF(2^{2m})$ there is a smallest positive integer "s" such that $$(\alpha^{3L})^s = 1$$

since 3L is a factor of $2^{2m}-1$. This is true when $3Ls = 2^{2^{2m}-1}$ or an integer multiple thereof since $\alpha^{2^{2m}-1}=1$ in $GF(2^{2m})$. We can then define a set T:

$$T = \{\alpha^{i3L} | i = 0,1, \ldots, s-1\}.$$

and a mapping function $$M(\gamma) = \gamma^{1/3} = \alpha^{iL}\alpha^{l\frac{2^{2m}-1}{3}},$$

where $\gamma = \alpha^{i3L} \in T$ and l is an element of $\{0,1,2\}$. This mapping function, which essentially implements the equation 22 of the prior method, maps $\alpha^{i3L} = \beta^L$, to $$(\beta^L)^{1/3} = \alpha^{iL}A$$

where $$A = \frac{l(2^m-1)}{3}$$

for some $l \in \{0,1,2\}$, A is divisible by 3, and $A^3=1$.

The mapping function $M(\gamma)$ can be implemented in a look-up table, which has s elements. For larger values of m, this table contains fewer elements than the look-up table of the method described in the co-pending application. For smaller values of m and thus smaller fields $GF(2^{2m})$, however, the size of this table is the same size as the table used in the prior method.

For a given element $\beta = \alpha^{3i} \in GF(2^{2m})$ the mapping function M produces $(\beta^L)^{1/3} = \alpha^{iL}A$. This product is then converted to the cubic root of $\beta$ by first multiplying the product by $\beta^V$:

$$(\beta^L)^{1/3}\beta^V = \alpha^{iL}A\alpha^{3iV} \qquad [23]$$

substituting $L+3V=2^Q$ into equation 23:

$$(\beta^L)^{1/3}\beta^V = (\alpha^i)^{2^Q}A \qquad [24]$$

Then, raising both sides of equation 24 to the $2^{2m-Q}$ power:

$$\left((\beta^L)^{\frac{1}{3}}\beta^V\right)^{2^{2m-Q}} = (\alpha^{i2^Q})^{2^{2m-Q}}A^{2^{2m-Q}}$$
$$= (\alpha^i)^{2^{2m}}A^{2^{2m-Q}} = \alpha^i A^{2^{2m-Q}}$$

Since $A^3=1$ and $\alpha^i=\beta^{1/3}$, we can show that $$\left[\left((\beta^L)^{\frac{1}{3}}\beta^V\right)^{2^{2m-Q}}\right]^3 = \left(\beta^{\frac{1}{3}}A^{2^{2m-Q}}\right)^3 = (\beta(1))^{2^{2m-Q}} = \beta$$

and $$\left((\beta^L)^{\frac{1}{3}}\beta^V\right)^{2^{2m-Q}}$$

is thus a cubic root of $\beta$, and further:

$$\beta^{1/3} = (M(\beta^L)\beta^V)^{2^{2m-Q}} \qquad [25]$$

The exponents L and V can be expressed as sums of powers of two:

$$L = \sum_{i=0}^{n_l} l_i 2^i \text{ and } V = \sum_{i=0}^{n_v} v_i 2^i$$

and thus, raising the element $\beta$ to the powers of L and V is readily implemented in hardware using conventional Galois Field multipliers.

Figure 5:
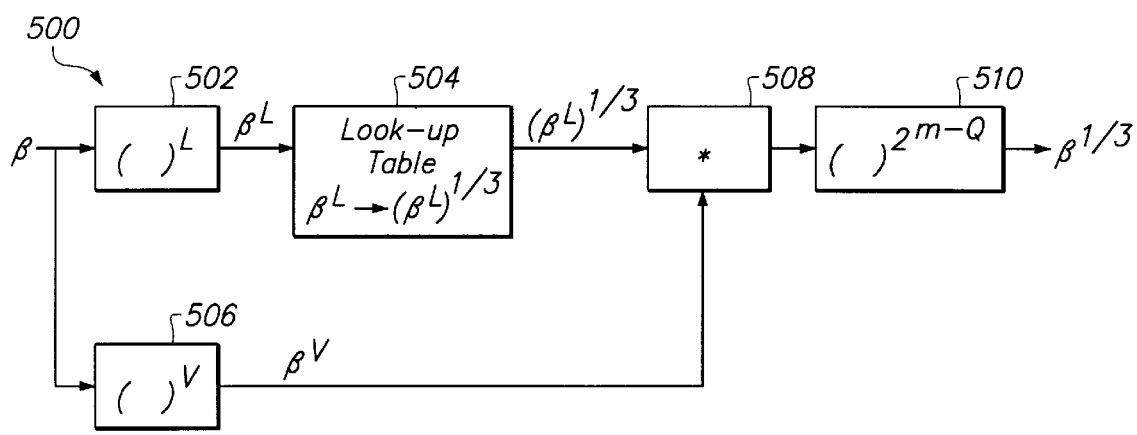
FIG. 5 is a functional block diagram of a subsystem for determining the cubic roots of elements of $GF(2^{2m})$.

Referring now to FIG. 5, a subsystem 500 determines the cubic root of an element $\beta$ of $GF(2^{2m})$ by first raising the element to the power L in multipliers 502. The subsystem then uses the value $\beta^L$ to enter a look-up table 504 that contains the results of mapping $\beta^L$ to $(\beta^L)^{1/3}$. The value read from the table 504 is then multiplied in multiplier 508 by $\beta^V$, which is produced in multipliers 506. Next, the product $(\beta^L)^{1/3}\beta^V$ is raised to the power $2^{m-Q}$ in multipliers 510, to produce a cubic root $(\beta)^{1/3}$.

The values of L, Q and V are given in Table I below for $GF(2^{2m})$ for $3 < m \leq 15$. The number of elements, s, in the look-up table is also included in the table. The value of L is chosen to minimize the number of elements in the look-up table. Also, if possible L is chosen such that there is a minimal number of non-zero values for $l_i$ and $v_b$, respectively.

TABLE I

| 2m | $2^{2m} - 1$ | L | Q | V | s |
|---|---|---|---|---|---|
| 6 | $3^2 * 7$ | 7 | 4 | 3 | 3 |
| 8 | $3 * 5 * 17$ | 17 | 5 | 5 | 5 |
| 10 | $3 * 11 * 31$ | 31 | 6 | 11 | 11 |
| 12 | $3^2 * 5 * 7 * 13$ | 1365 | 9 | 19 | 3 |
| 14 | $3 * 43 * 127$ | 127 | 8 | 43 | 43 |
| 16 | $3 * 5 * 17 * 257$ | 4369 | 14 | 4005 | 5 |
| 18 | $3^3 * 7 * 19 * 73$ | 9709 | 14 | 2225 | 9 |
| 20 | $3 * 5^2 * 11 * 31 * 41$ | 69905 | 17 | 20389 | 5 |
| 22 | $3 * 23 * 89 * 683$ | 60787 | 16 | 1583 | 23 |
| 24 | $3^2 * 5 * 7 * 13 * 17 * 241$ | 1864135 | 22 | 776723 | 3 |
| 26 | $3 * 2731 * 8191$ | 8191 | 14 | 2731 | 2731 |
| 28 | $3 * 5 * 29 * 43 * 113 * 127$ | 17895697 | 26 | 16404389 | 5 |
| 30 | $3^2 * 7 * 11 * 31 * 151 * 331$ | 119304647 | 27 | 4971027 | 3 |

2. No Look-Up Table Method

Consider first that an even-bit field $GF(2^{4m+2})$ is an extension field of the odd-bit field $GF(2^{2m+1})$, and thus, the odd-bit field is a sub-field of the even-bit field. If $\alpha$ is the primitive element of $GF(2^{4m+2})$, every element $\beta$ of $GF(2^{2m+1})$ can be expressed as $$\beta = (\alpha^i)^{2^{2m+1}+1}$$

for some integer i. Since $2^{2m+1}+1$ is divisible by 3, there is in $GF(2^{4m+2})$ a first cubic root:

$$(\alpha^i)^{2^{2m+1}+\frac{1}{3}} \qquad [26]$$

which is an element of the odd-bit field $GF(2^{m_0})$, where $m_0$ is an odd integer.

The root may not, however, be an element of $GF(2^{2m+1})$.

There are two additional roots that are related to the first root, namely $$\alpha^{i\frac{(2^{2m+1}+1)}{3} + \frac{(2^{4m+2}-1)}{3}} = \left(\alpha^{\frac{1}{3}}\right)^{i(2^{2m+1}+1) + \frac{2^{4m+2}-1}{3}} \qquad [27]$$

and $$\alpha^{i\frac{(2^{2m+1}+1)}{3} + \frac{(2^{4m+2}-1)}{3}} = \left(\alpha^{\frac{1}{3}}\right)^{i(2^{2m+1}+1) + 2(2^{4m+2}-1)} \qquad [28]$$

which are determined, respectively, by multiplying the first root by $\alpha^{2^{4m+2}-1} = \alpha^0 = 1$ and $\alpha^{2(2^{4m+2}-1)} = \alpha^0 + \alpha^0 = \alpha^0 = 1$. The cubic roots in $GF(2^{4m+2})$ are thus:

$$\beta^{\frac{1}{3}} = \beta^u = \alpha^{i\frac{(2^{2m+1}+1)}{3} + \frac{l(2^{4m+2}-1)}{3}} \qquad [29]$$

where the root is also an element of the odd-bit field $GF(2^{2m+1})$ for l equal to one of $\{0,1,2\}$. We now use this result to determine the cubic root of an element of any even-bit field $GF(2^{2m})$.

The even-bit field $GF(2^{2m})$ is an extension field of the odd-bit field $GF(2^{m_0})$, where $m = 2^k m_0$ and $m_0$ is an odd integer. For example, with $GF(2^4)$ $m=2$, and $k=1$ and $m_0=1$ and the field is an extension field of $GF(2)$; with $GF(2^{26})$, $m=13$, and $k=0$ and $m_0=13$, and the field is an extension field of the odd-bit field $GF(2^{13})$ and so forth.

Also, we can show that $$2^{2m} - 1 = (2^{m_0} - 1)N$$

where $N = (2^{m_0}+1)N_0$ and $N_0$ is a positive integer. To do this we substitute $2^k m_0$ for m and repeatedly use the identity $x^2 - 1 = (x-1)(x+1)$, where $x = 2^{m_0})^{2^k}$ in a first iteration.

For every $\beta \in GF(2^{2m})$, $\beta^N$ is an element of $GF(2^{m_0})$. Since $2^{m_0}+1$ is divisible by three, $$N = 3^e L$$

where $e > 0$ and L is not divisible by three. We use these results below to determine the cubic roots when $e = 1$ and when $e > 1$ in Sections 2a and 2b, respectively.

2a. When $e = 1$

To find the cubic root of an element $\beta$ of $GF(2^{2m})$, with $$\beta = \alpha^{3i}$$

where $\alpha$ is the primitive element of $GF(2^{2m})$, the system first raises the element $\beta$ to the power $N/3$ to produce:

$$\beta^{\frac{N}{3}} = \left(\beta^{\frac{1}{3}}\right)^N = (\alpha^i)^N$$

which is an element of the odd-bit field $GF(2^{m_0})$. As discussed above, the system then determines the cubic root over the odd-bit field by raising the element to the power $$u = \frac{2^{m_0+1} - 1}{3}$$

which based on equation 29 is:

$$\left(\beta^{\frac{N}{3}}\right)^u = \qquad [30]$$

$$\left(\beta^{\frac{N}{3}}\right)^{1/3} * \alpha^{\frac{l(2^m-1)}{3}} = \left(\left[(\alpha^{3i})^{\frac{3L}{3}}\right]^{1/3}\right) * \alpha^{l\left(\frac{2^m-1}{3}\right)} = \alpha^{iL} * \alpha^{l 2^m} - \frac{1}{3}$$

where $l \in \{0,1,2\}$, and for one of these values the cubic root is an element of $GF(2^{m_0})$. Letting $$A = \alpha^{l\left(\frac{2^m-1}{3}\right)}$$

the result of equation 30 is rewritten as:

$$\left(\beta^{\frac{N}{3}}\right)^u = \alpha^{iL} A. \qquad [31]$$

Multiplying both sides of equation 31 by $\beta^V$ $$\beta^V \left(\beta^{\frac{N}{3}}\right)^u = (\alpha^{iL})(\beta^V) = A(\alpha^{iL})((\alpha^{3i})^V)A = (\alpha^i)^{L+3V} A \qquad [32]$$

substituting $L + 3V = 2^Q$ into equation 32:

$$\beta^V \left(\beta^{\frac{N}{3}}\right)^u = (\alpha^i)^{2^Q} A \qquad [33]$$

further substituting $\beta^L$ for $\beta^{N/3}$ in equation 33:

$$\beta^V [(\beta^L)]^u = (\alpha^i)^{2^Q} A$$

and raising both sides to the power $2^{2m-Q}$, we produce:

$$[(\beta^L)^u \beta^V]^{2^{2m-Q}} = \alpha^i A^{2^{2m-Q}} = \beta^{\frac{1}{3}} A^{2^{2m-Q}}$$

which, as discussed above is the cube root of $\beta$, sine $A^3=1$.

Figure 6:
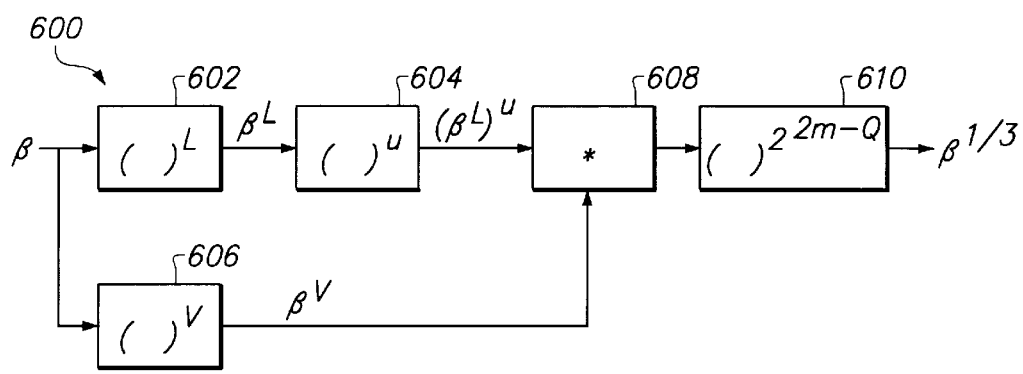
FIG. 6 is a functional block diagram of an alternative system for determining the cubic roots of elements of $GF(2^{2m})$.

Referring now to FIG. 6 a subsystem 600 determines the cubic root of an element $\beta$ of $GF(2^{2m})$ by first raising the element to the L power in multipliers 602, and then raising the result to the u power in multipliers 604. The subsystem next multiplies in multipliers 608 the product $(\beta^L)^u$ by $\beta^V$, which is produced by multipliers 606, and in multipliers 610 raising the result to the 22 power.

2b. When e>1

As discussed above, we raise $\beta \in GF(2^{2m})$ to the $N/3$ power to produce $$\beta^{N/3} = (\alpha^i)^N$$

which is an element of $GF(2^{m_0})$. Then, we raise the result to the power $$u = \frac{2^{m_0+1}-1}{3}$$

to produce $$\left(\beta^{\frac{N}{3}}\right)^u = (\alpha^{iN})^{u^e} = \alpha^{i3^{e-1}L_1 \frac{2^{2m-1}}{3}} \quad [26]$$

where $l_1$ is one of $\{0, 1, 1\}$. The root, which is an element of $GF(2^{m_0})$, is then raised to the u power and so forth until we produce the product $$\left(\beta^{\frac{N}{3}}\right)^{u^e} = (\alpha^{iN})^{u^e} = \alpha^{iL} A_e \quad [27]$$

where $A_e$ is equal to $\alpha$ to the power $$\sum_{j=1}^{e} l_j \frac{2^{2m}-1}{3^{e-j+1}}$$

Next, we multiply both sides of equation 27 by $\beta^V = \alpha^{3iV}$, to produce $$\left(\beta^{\frac{N}{3}}\right)^{u^e} \beta^V = \alpha^{iL} \alpha^{i3V} \quad [28]$$

and substitute $L+3V=2^Q$ into equation 28 to produce $$\left(\beta^{\frac{N}{3}}\right)^{u^e} \beta^V = (\alpha^i)^{2^Q} A.$$

We then raise both sides to the 22 power:

$$\left[\left(\beta^{\frac{N}{3}}\right)^{u^e} \beta^V\right]^{2^{2m-Q}} = \alpha^i A^{2^{2m-Q}}$$

However $\alpha^i = \beta^{1/3}$, and we have $$\beta^{\frac{1}{3}} A = \left[\left(\beta^{\frac{N}{3}}\right)^{u^e} \beta^V\right]^{2^{2m-Q}}$$

Since $$(A^{2^{2m-Q}})^3 = \left(\alpha^{\sum_{i=1}^{e-1} l_i \frac{2^{2m-1}}{i^{e-j}}}\right)^{2^{2m-Q}}$$

it may not equal 1, which means that $\alpha^i A^{2^{2m-Q}}$ may not be a cubic root of $\beta$. However, $$(A^{2^{2m-Q}})^{3^e} = 1$$

and thus $(\alpha^i A^{2^{2m-Q}})^{3^e} = (\alpha^{i3})^e = \beta^e$ and $$\beta = \left(\alpha^i A^{2^{2m-Q}}\right)^3 \alpha^{k \frac{2^{2m}-1}{3^{e-1}}}$$

for some $k \in \{0, 1, 2 \ldots 3^{e-1}-1\}$, and thus, $$\beta^{\frac{1}{3}} = \left(\alpha^i A^{2^{2m-Q}}\right) \alpha^{k \frac{2^{2m}-1}{3^e}} \quad [28]$$

The cubic roots can then be found by trying different values of k and testing the result by cubing it.

Alternatively, a look-up table with $3^{e-1}$ elements may be used to determine the cubic root. Since $$(\alpha^i A^{2^{2m-Q}})^{3^e} = \beta(A^{2^{2m-Q}})^3$$

we can determine $(A^{2^{m-Q}})^3$ by dividing $(\alpha^i A^{2^{2m-Q}})^3$ by $\beta$. There are at most $3^{e-1}$ possible values of $kA^{2^{2m-Q}}$, namely, $$kA^{2^{2m-Q}} = \alpha^{\sum_{i=1}^{e-1} l_{kj} \frac{2^{2m-1}}{3^{e-j-1}}}$$

for $l_{kj} \in \{0,1,2\}$
such that $$A^{2^{2m-Q}} = \alpha^{\sum_{i=1}^{e-1} l_{kj} \frac{2^{2m-1}}{3^{e-j-1}}}$$

The look-up table is entered with the value $k^3 A^{2^{2m-Q}}$ and produces the value $kA^{2^{2m-Q}}$. Then, the cubic root of $\beta$ is:

$$\frac{\alpha^i A^{2^{2m-Q}}}{kA^{2^{2m-Q}}} = \alpha^i \alpha^{le \frac{(2^{2m}-1)}{3}}$$

We list below in Table II the values of N, e, u, Q and V for $GF(2^{2m}) 3m \leq 15$. When e=1, no look-up table is used. When e>1, the subsystem may use a look-up table of the size $3^{e-1}$, which is listed in the last column of the table. An entry of 0 in the column indicates that no table is used. Alternatively, various values of k may instead be substituted into equation 28, to determine the cubic roots.

TABLE II

| 2m | $m_0$ | N/3 | e | u | Q | V | s |
|---|---|---|---|---|---|---|---|
| 6 | 3 | 3 | 2 | 5 | 0 | 0 | 3 |
| 8 | 1 | 85 | 1 | 1 | 8 | 57 | 0 |
| 10 | 5 | 11 | 1 | 21 | 5 | 7 | 0 |
| 12 | 3 | 195 | 2 | 5 | 7 | 22 | 3 |
| 14 | 7 | 43 | 1 | 85 | 6 | 7 | 0 |
| 16 | 1 | 21845 | 1 | 1 | 15 | 3642 | 0 |
| 18 | 9 | 171 | 3 | 341 | 6 | 15 | 9 |
| 20 | 5 | 11275 | 1 | 21 | 14 | 1703 | 0 |
| 22 | 11 | 683 | 1 | 1365 | 11 | 455 | 0 |
| 24 | 3 | 798915 | 2 | 5 | 20 | 260757 | 3 |
| 26 | 13 | 2731 | 1 | 5461 | 12 | 155 | 0 |
| 28 | 7 | 704555 | 1 | 85 | 21 | 464199 | 0 |
| 30 | 15 | 10923 | 2 | 21845 | 13 | 1517 | 3 |

What is claimed is:

1. A method of operating a data processing system to determine the locations of erroneous symbols in a code word over $GF(2^{2m+1})$, the method including the steps of:
   i. receiving a code word with erroneous data symbols;
   ii. determining an associated error locator polynomial;
   iii. transforming the error locator polynomial to a degree three polynomial;
   iv. substituting variables in the degree three polynomial to produce in an extension field $GF(2^{4m+2})$ an equation $(y_1, y_2)^3 + (0,b)(y_1, y_2) + (0, a) = 0$;
   v. substituting variables to produce a quadratic equation $(z_1, z_2)^2 + (0,b)(z_1, z_2) + (0,a)^3 = 0$
   where $(z_1, z_2)$ is an element of $GF(2^{4m+2})$ and solving the quadratic equation for $(z_1, z_2)$;
   vi. determining the cube root, $(s,t)$, of $(z_1, z_2)$;
   vii. determining the roots, s, t, and s+t, of the equation of step iv based on the value of (s,t) of step vi; and
   viii. determining that the code word symbols associated with the code word locations that correspond to the roots s, t and s+t are erroneous; and
   ix. based on the location information
      a. correcting errors in the data symbols of the code word,
      b. labeling the code word as uncorrectable, or
      c. requesting that the code word is again received and repeating steps i–ix as necessary.

2. The method of claim 1 wherein the step of determining the cube root of $(z_1,z_2)$ includes raising $\beta=(z_1,z_2)$ to a power $$u = \frac{2^{2m+2}-1}{3}$$

to produce the element that is the cubic root of $\beta$.

3. The method of claim 1 wherein the step of determining the cube root of $(z_1,z_2)$ includes the steps of:
   i. raising $\beta=(z_1,z_2)$ to a power L, where L is a factor of $2^{2m}-1$;
   ii. raising $\beta$ to a power V where $L+3V=2^Q$;
   iii. determining a cubic root of $\beta^L$;
   iv. multiplying $(\beta^L)^{1/3}$ by $\beta^V$; and
   v. raising $(\beta^L)^{1/3} \beta^V$ to a power $2^{2m-Q}$ to produce the element that is the cubic root of $(z_1, z_2)$.

4. The method of claim 1 wherein the step of determining the cube root of $(z_1,z_2)$ includes the steps:
   i. raising $\beta=(z_1,z_2)$ to a power L, where L is a factor of $2^{2m}-1$;
   ii. raising $\beta^L$ to a power $$u = \frac{2^{m_0-1}-1}{3}$$

where $m_0 = 2^k m$
   iii. raising the element $\beta$ to a power V, where $L+3V=2^Q$
   iv. multiplying $(\beta^L)^u$ by $\beta^V$; and
   raising $(\beta^L)^u \beta^V$ to a power $2^{2m-Q}$ to produce the element that is the cubic root of $(z_1, z_2)$.

5. A method of operating a data processing system to identify erroneous symbols in a code word, the method including the steps of:
   A. receiving a code word with erroneous data symbols and producing an associated degree-three polynomial with a term $\beta^3$ that is an element of $GF(2^{2m+1})$;
   B. raising the element $\beta^3$ to a power $$u = \frac{2^{2m+2}-1}{3}$$

to produce the cubic root of $\beta$; and
   C. using the cubic root of $\beta$, identifying which data symbols of the received code word are erroneous and
      i. correcting the errors in the data symbols of the code word,
      ii. labeling the code word as uncorrectable, or
      iii. requesting receipt of the code word again and repeating steps A–C as necessary.

6. A method of operating a data processing system to identify erroneous data symbols in a code word, the method including the steps of:
   i. receiving a code word with erroneous data symbols and producing an associated degree-three polynomial with a term $\beta^3$ that is an element of $GF(2^{2m})$;
   ii. raising the element $\beta^3$ to a power L, where L is a factor of $2^{2m}-1$;
   iii. raising , to a power V where $L+3V=2^Q$;
   iv. using $\beta^L$ to enter a stored lookup table to retrieve the cubic root of $\beta^L$;
   v. multiplying $(\beta^L)^{1/3}$ by $\beta^V$;
   vi raising $(\beta^L)^{1/3} \beta^V$ to a power $2^{2m-Q}$ to produce the cubic root of; and
   vii using the cubic root of $\beta$, identifying which data symbols of the received code word are erroneous and
      a. correcting the errors in the data symbols of the code word,
      b. labeling the code word as uncorrectable, or
      c. requesting receipt of the code word again and repeating steps i-vii as necessary.

7. A method of operating a data processing system to identify erroneous data symbols in a received code word, the method including the steps of:
   i. receiving a code word with erroneous data symbols and producing an associated degree-three polynomial with a term $\beta^3$ that is an element of $GF(2^{2m})$;
   ii. raising the element $\beta$ to a power L, where L is a factor of $2^{2m}-1$;

iii. raising $\beta^L$ to a power $$u = \frac{2^{m_0-1}-1}{3}$$

where $m_0 = 2^k m$ iv. raising the element $\beta$ to a power V, where $L+3V=2^Q$
v. multiplying $(\beta^L)^u$ by $\beta^V$;
vi. raising $(\beta^L)^u \beta^V$ to a power $2^{2m-Q}$ to produce the cubic root; and
vii. using the cubic root of $\beta$, identifying which data symbols of the received code word are erroneous and
   a. correcting the errors in the data symbols of the code word,
   b. labeling the code word as uncorrectable, or
   c. requesting receipt of the code word again and repeating steps i–vii as necessary.

8. A data processing system for determining the roots of a degree-three polynomial that is associated with a data codeword over $GF(2^{2m+1})$, the system including:
   A. a processor for receiving a data code word containing errors and determining an associated degree-three polynomial;
   B. manipulation means for substituting variables in the degree three polynomial to produce in an extension field $GF(2^{4m+2})$ an equation $(y_1, y_2)^3+(0,b)(y_1, y_2)+(0,a)=0$;
   C. manipulation means for substituting variables to produce a quadratic equation $(z_1, z_2)^2+(0,b)(z_1, z_2)+(0,a)^3=0$
where $(z_1, z_2)$ is an element of $GF(2^{4m+2})$ and solving the quadratic equation for $(z_1, z_2)$;
   D. calculating means for calculating the cube root, (s,t), of $(z_1, z_2)$; and
   E. means for transforming the roots (s, t) and s+t to the roots of the degree-three polynomial and associating the roots with the locations of erroneous data symbols in the data code word; and
   F. an error correction processor for
      i. correcting the erroneous data symbols in the code word,
      ii. labeling the code word uncorrectable, or
      iii. sending a repeat request for the code word.

9. The system of claim 8 wherein the calculating means includes a multiplier for raising $\beta=(z_1, z_2)$ to a power $$u = \frac{2^{2m+2}-1}{3}$$

to produce the element that is the cubic root of $\beta$.

10. The system of claim 8 wherein the calculating means includes
   i. one or more first multipliers for raising $\beta=(z_1,z_2)$ to a power L, where L is a factor of $2^{2m}-1$;
   ii. one or more second multipliers for raising $\beta$ to a power V where $L+3V=2^Q$;
   iii. means for determining a cubic root of $\beta^L$;
   iv. one or more third multipliers for multiplying the cubic root by $\beta^V$; and
   v. one or more fourth multipliers for raising the product produced by the one or more third multipliers to a power $2^{2m-Q}$ to produce the cubic root.

11. The system of claim 10 wherein the means for determining a cubic root of $\beta^L$ includes a lookup table.

12. The system of claim 10 wherein the means for determining a cubic root of $\beta^L$ includes one or more fifth multipliers for raising $\beta^L$ to a power $$u = \frac{2^{m_0-1}-1}{3},$$

where $m_0 = 2^k m$.

13. A data processing system for determining error locations in a data code word, the system including:
   A. a first processor for receiving the data code word and determining an associated degree-three polynomial;
   B. a cubic root processor for calculating the cubic root of a multiple bit symbol $\beta$ that is associated with the degree-three error locator polynomial and is also an element of $GF(2^{2m})$, the cubic root processor including
      i. one or more first multipliers for raising $\beta$ to a power L, where L is a factor of $2^{2m}-1$;
      ii. one or more second multipliers for raising $\beta$ to a power V where $L+3V=2^Q$;
      iii. means for determining a cubic root of $\beta^L$;
      iv. one or more third multipliers for multiplying the cubic root by $\beta^V$; and
      v. one or more fourth multipliers for raising the product produced by the one or more third multipliers to a power $2^{2m-Q}$ to produce the multiple bit symbol that is cubic root of $\beta$; and
   C. a second processor for determining which symbols are in error in the data code word based on the multiple bit symbol that is the cubic root of $\beta$, the error location processor providing error location information to an error correction processor.

14. The system of claim 13 wherein the means for determining a cubic root of $\beta^L$ includes a lookup table.

15. The system of claim 13 wherein the means for determining a cubic root of $\beta^L$ includes one or more fifth multipliers for raising $\beta^L$ to a power $$u = \frac{2^{m_0-1}-1}{3},$$

where $m_0 = 2^k m$.

* * * * *